(12) United States Patent
Ishii et al.

(10) Patent No.: US 11,264,414 B2
(45) Date of Patent: Mar. 1, 2022

(54) IMAGE SENSOR

(71) Applicant: Samsung Electronics Co., Ltd., Suwon-si (KR)

(72) Inventors: Masaru Ishii, Hwaseong-si (KR); Tae-hyoung Kim, Suwon-si (KR); Min-ho Jang, Suwon-si (KR); In-sung Joe, Seoul (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

(21) Appl. No.: 16/458,229

(22) Filed: Jul. 1, 2019

(65) Prior Publication Data

US 2020/0227452 A1  Jul. 16, 2020

(30) Foreign Application Priority Data

Jan. 11, 2019 (KR) .................. 10-2019-0003942

(51) Int. Cl.
*H01L 27/146* (2006.01)

(52) U.S. Cl.
CPC .... *H01L 27/14603* (2013.01); *H01L 27/1462* (2013.01); *H01L 27/1463* (2013.01); *H01L 27/14612* (2013.01); *H01L 27/14649* (2013.01); *H01L 27/14689* (2013.01)

(58) Field of Classification Search
CPC ......... H01L 27/14623; H01L 27/14625; H01L 27/14629; H01L 27/1464
See application file for complete search history.

(56) References Cited

U.S. PATENT DOCUMENTS

| | | | |
|---|---|---|---|
| 7,511,750 B2 | 3/2009 | Murakami | |
| 9,525,006 B2 | 12/2016 | Nam et al. | |
| 9,819,846 B2 | 11/2017 | Masuda et al. | |
| 10,044,918 B2 | 8/2018 | Masuda et al. | |
| 10,050,078 B2 | 8/2018 | Jin et al. | |
| 10,483,309 B1* | 11/2019 | Lee | H01L 27/14627 |
| 2016/0351605 A1* | 12/2016 | Yang | H01L 27/14625 |
| 2017/0110493 A1 | 4/2017 | Yokogawa | |
| 2018/0158857 A1 | 6/2018 | Oshiyama et al. | |
| 2019/0319054 A1* | 10/2019 | Han | H01L 27/14627 |

FOREIGN PATENT DOCUMENTS

| | | |
|---|---|---|
| JP | 2009-218357 A | 9/2009 |
| JP | 4442157 B2 | 3/2010 |
| JP | 2011023503 A * | 2/2011 |
| JP | 2012-084815 A | 4/2012 |
| JP | 2013-033864 A | 2/2013 |

* cited by examiner

*Primary Examiner* — Shih Tsun A Chou
*Assistant Examiner* — Peter M Albrecht
(74) *Attorney, Agent, or Firm* — Muir Patent Law, PLLC

(57) ABSTRACT

An image sensor includes a semiconductor substrate having opposite first and second surfaces, a wiring structure on the first surface of the semiconductor substrate, and a refractive structure on the second surface of the semiconductor substrate. The refractive structure includes a first anti-reflective layer on the second surface of the semiconductor substrate, a refractive pattern on the first anti-reflective layer, an insulation layer on the first anti-reflective layer, and a second anti-reflective layer on the refractive pattern and the insulation layer. The refractive pattern includes first refractive parts spaced apart from each other in a first direction parallel to the second surface of the semiconductor substrate, and the insulation layer fills spaces between the first refractive parts.

17 Claims, 16 Drawing Sheets

IMAGE SENSOR

CROSS-REFERENCE TO RELATED APPLICATION

This application claims priority under 35 U.S.C. § 119 to Korean Patent Application No. 10-2019-0003942, filed on Jan. 11, 2019 in the Korean Intellectual Property Office, the disclosure of which is hereby incorporated by reference in its entirety.

TECHNICAL FIELD

Example embodiments of the present disclosure relate to an image sensor.

DISCUSSION OF RELATED ART

Image sensors convert an optical image into an electrical signal. The image sensors include a photodiode region in a semiconductor substrate to receive light and convert the light into an electrical signal. In the image sensors for sensing infrared light, an infrared absorption rate of the semiconductor substrate is relatively low, and thus the ratio of signal to noise of the image sensors may be low and thus the image sensors may have low sensitivity.

SUMMARY

According to example embodiments of the inventive concepts, an image sensor includes a semiconductor substrate having a first surface and a second surface opposite to the first surface, a wiring structure on the first surface of the semiconductor substrate, and a refractive structure on the second surface of the semiconductor substrate. The refractive structure includes a first anti-reflective layer on the second surface of the semiconductor substrate, a refractive pattern on the first anti-reflective layer, an insulation layer on the first anti-reflective layer, and a second anti-reflective layer on the refractive pattern and the insulation layer. The refractive pattern includes a plurality of first refractive parts spaced apart from each other in a first direction parallel to the second surface of the semiconductor substrate, and the insulation layer fills spaces between the plurality of first refractive parts.

According to example embodiments of the inventive concepts, an image sensor includes a semiconductor substrate having a first surface and a second surface opposite to the first surface, a wiring structure on the first surface of the semiconductor substrate, and a refractive structure on the second surface of the semiconductor substrate. The refractive structure includes a first anti-reflective layer on the second surface of the semiconductor substrate, and a refractive pattern on the first anti-reflective layer. The refractive pattern includes a plurality of first refractive parts spaced apart from each other in a first direction parallel to the second surface of the semiconductor substrate. The second surface of the semiconductor substrate is flat.

According to example embodiments of the inventive concepts, an image sensor includes a semiconductor substrate having a first surface and a second surface opposite to the first surface, a wiring structure on the first surface of the semiconductor substrate, and a refractive structure on the second surface of the semiconductor substrate. The refractive structure includes a first anti-reflective layer on the second surface of the semiconductor substrate, a plurality of refractive parts disposed on the first anti-reflective layer, an insulation layer on the first anti-reflective layer, and a second anti-reflective layer on the plurality of refractive parts and the insulation layer. The plurality of first refractive parts are spaced apart from each other in a first direction parallel to the second surface of the semiconductor substrate. The insulation layer fills spaces between the plurality of first refractive parts. The refractive pattern includes polysilicon. The insulation layer includes a material having a refractive index lower than a refractive index of the refractive pattern.

DETAILED DESCRIPTION

Figure 1:
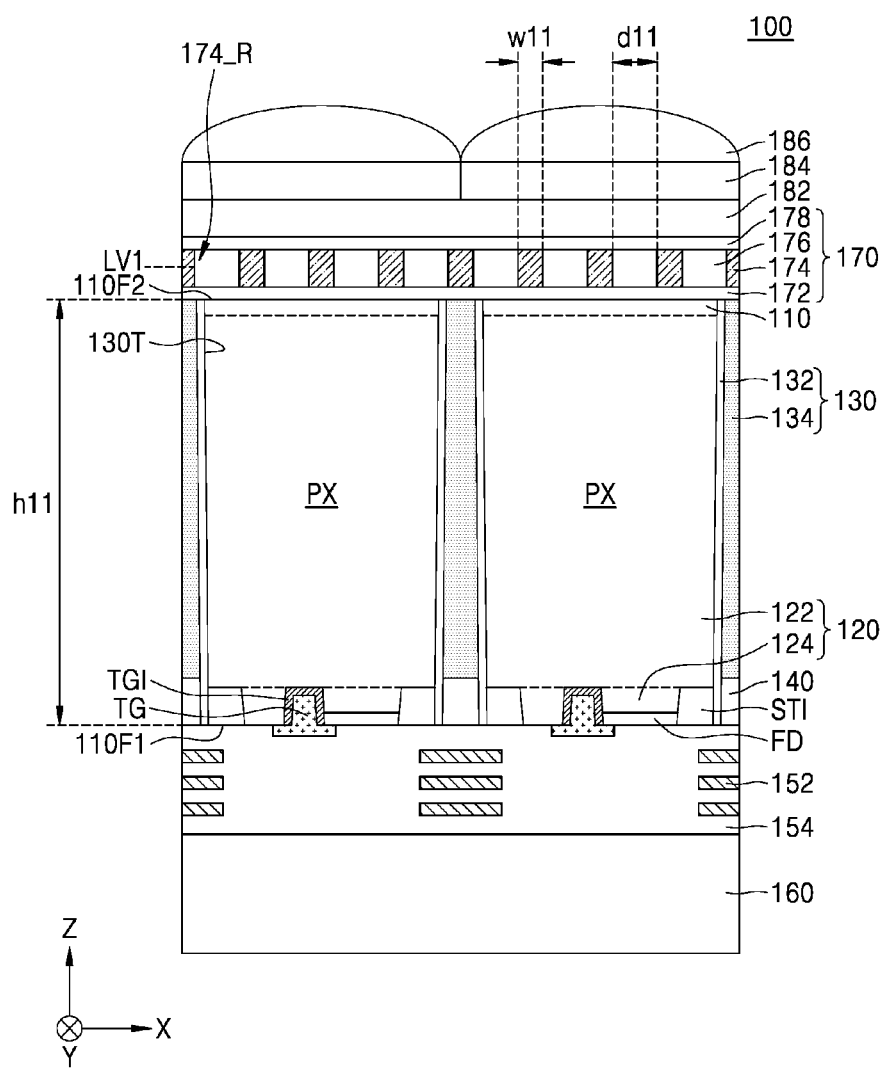
FIG. 1 is a cross-sectional view of an image sensor according to example embodiments of the inventive concept.

Various example embodiments will now be described more fully hereinafter with reference to the accompanying drawings. Like reference numerals may refer to like elements throughout this application.

Figure 2:
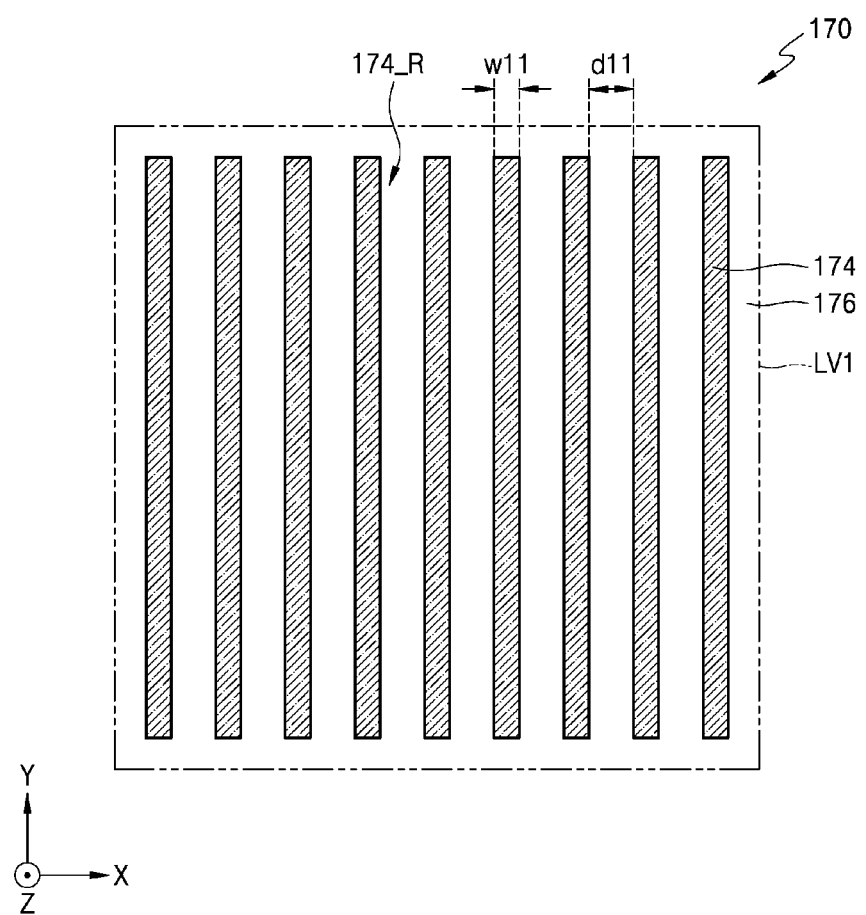
FIG. 2 is a plan view at a first level LV1 of FIG. 1.

FIG. 1 is a cross-sectional view of an image sensor according to example embodiments of the inventive concept. FIG. 2 is a plan view at a first level LV1 of FIG. 1.

Referring to FIGS. 1 and 2, a semiconductor substrate 110 may have a first surface 110F1 and a second surface 110F2 that are opposite to each other. The semiconductor substrate 110 may include a p-type semiconductor substrate. For example, the semiconductor substrate 110 may include a p-type silicon substrate. In some embodiments, the semiconductor substrate 110 may include a p-type bulk substrate and a p- or n-type epitaxial layer thereon. In some embodiments, the semiconductor substrate 110 may include an n-type bulk substrate and a p- or n-type epitaxial layer thereon. In some embodiments, the semiconductor substrate 110 may include an organic plastic substrate.

A plurality of active pixels PX may be arranged in the semiconductor substrate 110. For example, the plurality of active pixels PX may be arranged in a matrix form in a plan view, and a plurality of photoelectric conversion regions 120 may be disposed in the plurality of active pixels PX, respectively. The plurality of photoelectric conversion regions 120 may be regions for generating an electrical signal from light incident through the second surface 110F2 of the semiconductor substrate 110. For example, the plurality of photoelectric conversion regions 120 may be regions for generating an electrical signal from infrared light incident through the second surface 110F2 of the semiconductor substrate 110, but the inventive concept is not limited thereto.

Each of the plurality of photoelectric conversion region 120 may include a photodiode region 122 and a well region 124. The photodiode region 122 may have a first conductivity type, for example, an n-type. The well region 124 may have a second conductivity type, for example, a p-type. The well region 124 may be formed by doping the semiconductor substrate 110 with an impurity having the second conductivity type. An impurity concentration of the well region 124 may be greater than an impurity concentration of the semiconductor substrate 110.

In FIG. 1, a portion of the semiconductor substrate 110, in which the plurality of active pixels PX are disposed, is exemplarily illustrated. In some embodiments, the semiconductor substrate 110 may further include a peripheral circuit region and a pad region. The peripheral circuit region may be a region in which various kinds of circuits configured to control the plurality of active pixels PX is formed. For example, the circuit region may include a plurality of transistors, and the plurality of transistors may be configured to provide a constant signal to each of the photoelectric conversion regions 120 and to control an output signal generated from each of the photoelectric conversion regions 120. For example, the transistors may constitute various kinds of logic circuits such as a timing generator, a column decoder, a row driver, a correlated double sampler (CDS), an analog to digital converter (ADC), a latch, a column decoder, or the like, but is not limited thereto. The pad region may include a conductive pad electrically connected to the plurality of active pixels PX and the circuit included in the peripheral circuit region and may function as a connection terminal to provide power and a signal from the outside to the circuit included in the peripheral circuit region and the plurality of active pixels PX.

A pixel isolation layer 130 may extend through the first surface 110F1 of the semiconductor substrate 110 to the second surface 110F2 of the semiconductor substrate 110. The pixel isolation layer 130 may be disposed between one of the plurality of photoelectric conversion region 120 and another photoelectric conversion region 120 adjacent thereto and may electrically and physically separate them. The pixel isolation layer 130 may be disposed between two adjacent photoelectric conversion regions of the plurality of photoelectric conversion region 120 arranged in the matrix form and may have a grid or mesh shape in a plan view. In an example embodiment, the pixel isolation layer 130 may surround each of the plurality of photoelectric conversion region 120 in a plan view.

The pixel isolation layer 130 may be formed in a pixel trench 130T passing through the first surface 110F1 of the semiconductor substrate 110 to the second surface 110F2 of the semiconductor substrate 110. The pixel isolation layer 130 may include an insulation liner 132 extending conformally along a sidewall of the pixel trench 130T and a buried conductive layer 134 disposed on the insulation liner 132 and filling the pixel trench 130T.

In some embodiments, the insulation liner 132 may include metal oxide, for example, hafnium oxide, aluminum oxide, or tantalum oxide. In this case, the insulation liner 132 may act as a negative fixed charge layer. However, the inventive concept is not limited thereto. In some embodiments, the insulation liner 132 may include an insulation material, for example, silicon oxide, silicon nitride, or silicon oxynitride. The buried conductive layer 134 may include doped polysilicon.

The buried conductive layer 134 may not fill a portion of the pixel trench 130T. A lower surface of the buried conductive layer 134 may be disposed at a higher level than the first surface 110F1 of the semiconductor substrate 110 (i.e., the lower surface of the buried conductive layer 134 may be spaced apart from the first surface 110F1 of the semiconductor substrate 110 at a predetermined distance in a vertical direction Z. A buried insulation layer 140 may be disposed on the lower surface of the buried conductive layer 134 and may fill the remainder of the pixel trench 130T. The insulation liner 132 may be interposed between the buried insulation layer 140 and the sidewall of the pixel trench 130T. A lower surface of the buried insulation layer 140 may be located at the same level as the first surface 110F1 of the semiconductor substrate 110. In an example embodiment, the lower surface of the buried insulation layer 140 may be in contact with the first surface 110F1 of the semiconductor substrate 110. The term "contact" or "in contact with" as used herein refers to a direct connection (e.g., touching). The present invention, however, is not limited thereto. Unlike those shown in FIG. 1, the buried insulation layer 140 may be omitted, and the buried conductive layer 134 may fill the pixel trench 130T over the overall height (or depth) h11 of the pixel trench 130T, such that the lower surface of the buried conductive layer 134 may be located at the same level as the first surface 110F1 of the semiconductor substrate 110. In an example embodiment, the lower surface of the buried conductive layer 134 may be in contact with the first surface 110F1 of the semiconductor substrate 110.

Referring to FIG. 1, a device isolation layer ST1 defining an active region (not shown) and a floating diffusion region FD may be formed in the first surface 110F1 of the semiconductor substrate 110.

Gate electrodes (e.g., TG, RG, and SG of FIG. 6) constituting a plurality of transistors may be formed on the first surface 110F1 of the semiconductor substrate 110. For example, the plurality of transistors may include a transfer transistor (e.g., TX of FIG. 6) configured to transfer charges generated in the photoelectric conversion region 120 to the floating diffusion region FD, a reset transistor (e.g., RX of FIG. 6) configured to periodically reset the charges charged in the floating diffusion region FD, a drive transistor (e.g., DX of FIG. 6) configured to act as a source follower buffer amplifier and to buffer signals depending on the charges charged in the floating diffusion region FD, and a select transistor (see SX of FIG. 6) configured to act as a switching and addressing device to select the active pixels PX. The present invention is not limited thereto.

A transfer gate TG constituting the transfer transistor (e.g., TX of FIG. 6) may be formed in a recess gate type that extends from the first surface 110F1 of the semiconductor substrate 110 into the semiconductor substrate 110, but is not limited thereto. A transfer gate insulation layer TGI may be disposed between the semiconductor substrate 110 and the transfer gate TG. As the transfer gate TG is formed in the recess gate type, a portion of the transfer gate insulation layer TGI may extend into the semiconductor substrate 110.

A wiring structure 152 may be disposed on the first surface 110F1 of the semiconductor substrate 110. The wiring structure 152 may be electrically connected to the active region and/or the gate electrodes. The wiring structure 152 may be formed of a stack of plurality of conductive layers. The wiring structure 152 may include at least one of polysilicon, metal, metal silicide, metal nitride, and a metal containing layer. For example, the wiring structure 152 may include tungsten, aluminum, copper, tungsten silicide, titanium silicide, tungsten nitride, titanium nitride, or doped polysilicon.

A first interlayer insulation layer 154 may be disposed on the first surface 110F1 of the semiconductor substrate 110 to cover the wiring structure 152. The first interlayer insulation layer 154 may include silicon oxide, silicon nitride, or silicon oxynitride.

A supporting substrate 160 may be disposed on the first interlayer insulation layer 154. An adhesive (not shown) may be further disposed between the supporting substrate 160 and the first interlayer insulation layer 154. In an example embodiment, the supporting substrate 160 may be omitted.

A refractive structure 170 may be disposed at a first level LV1 on the second surface 110F2 of the semiconductor substrate 110. The second surface 110F2 of the semiconductor substrate 110 may be substantially flat. For example, the second surface 110F2 of the semiconductor substrate 110 vertically overlapped with the plurality of active pixels PX may have a substantially flat level, a recess or a hole extending from the second surface 110F2 of the semiconductor substrate 110 into the semiconductor substrate 110 may not be formed, and a step portion may not be formed in the second surface 110F2 of the semiconductor substrate 110.

The refractive structure 170 may include a first anti-reflective layer 172, a refractive pattern 174, an insulation layer 176, and a second anti-reflective layer 178.

The first anti-reflective layer 172 may extend over substantially the entirety of the second surface 110F2 of the semiconductor substrate 110 and may contact an upper surface of the pixel isolation layer 130 located at the same level as the second surface 110F2 of the semiconductor substrate 110. In some embodiments, the first anti-reflective layer 172 may include metal oxide, for example, hafnium oxide, aluminum oxide, or tantalum oxide. In some embodiments, the first anti-reflective layer 172 may include an insulating material, for example, silicon oxide, silicon nitride, silicon oxynitride, or a low-k dielectric material, such as SiCN or SiCO.

The refractive pattern 174 may be disposed on the first anti-reflective layer 172 and may include a plurality of first refractive parts 174_R. In some embodiments, the refractive pattern 174 may include polysilicon.

Referring to FIG. 2, the plurality of first refractive parts 174_R may have a plurality of linear shapes. For example, the plurality of first refractive parts 174_R may each have a first width w11 in a first direction X parallel to the second surface 110F2 of the semiconductor substrate 110 and may extend in a second direction Y parallel to the second surface 110F2 of the semiconductor substrate 110 and perpendicular to the first direction X. The plurality of first refractive parts 174_R may be spaced apart from each other at a first distance d11 in the first direction X. Referring to FIG. 2, the plurality of first refractive parts 174_R may each have the same first width w11 and may be spaced apart from each other at the same first distances d11 in the first direction X. The present invention is not limited thereto. In some embodiments, the first widths w11 of the plurality of first refractive parts 174_R may be different and the first distances d11 between the plurality of first refractive parts 174_R may be different. In some embodiments, at least one of the plurality of first refractive parts 174_R may have a width different from the first width w11 and may be spaced apart from another at a distance different from the first distance d11.

The insulation layer 176 may be disposed on the first anti-reflective layer 172 and may fill spaces between the plurality of first refractive parts 174_R. A portion of the insulation layer 176 may cover opposite ends of the plurality of first refractive parts 174_R extending in the second direction Y. In this case, the insulation layer 176 may surround each of the plurality of first refractive parts 174_R. An upper surface of the insulation layer 176 may be coplanar with an upper surface of the refractive pattern 174. For example, the upper surface of the insulation layer 176 and the upper surface of the refractive pattern 174 may be located at the same height from the first anti-reflective layer 172. For the convenience of description, the first anti-reflective layer 172 is used as reference for the height comparison. The other material layer such as the first surface 110F1 and the wiring structure 152 may be used for that purpose. The insulation layer 176 may include a material having a lower refractive index than polysilicon. For example, the insulation layer 176 may include silicon oxide, silicon nitride, silicon oxynitride, or a low-k dielectric material such as SiCN, or SiCO.

The second anti-reflective layer 178 may be disposed on the refractive pattern 174 and the insulation layer 176. The second anti-reflective layer 178 may include metal oxide, for example, hafnium oxide, aluminum oxide, or tantalum oxide. In some embodiments, the second anti-reflective layer 178 may include an insulating material, for example, silicon oxide, silicon nitride, silicon oxynitride, or a low-k dielectric material, such as SiCN or SiCO.

A passivation layer 182 may be disposed on the refractive structure 170. The passivation layer 182 may contact an upper surface of the second anti-reflective layer 178. A color filter 184 and a microlens 186 may be disposed on the passivation layer 182.

In general, in an image senor for sensing infrared light, an infrared light absorption rate of a semiconductor substrate such as a silicon substrate may be relatively low. Thus, to improve the sensitivity of an infrared image sensor, a recess may be formed in the semiconductor substrate by an etching process, and then the recess may be filled with an insulating material to form a concavo-convex pattern. However, the semiconductor substrate may be damaged by the etching process. Accordingly, a dark current noise may increase.

According to example embodiments of the inventive concept, the refractive structure 170 may be configured to refract the light incident on the second surface 110F2 of the semiconductor substrate 110 at a boundary between the refractive pattern 174 and the insulation layer 176 before the light passes through the second surface 110F2 of the semiconductor substrate 110. Thus, the light passing through the refractive structure 170 may enter the inside of semiconductor substrate 110 at a relatively great inclination angle with respect to a normal line of the second surface 110F2 of the semiconductor substrate 110. For example, when the infrared light is incident on the second surface 110F2 of the semiconductor substrate 110, the infrared light may enter the inside of the semiconductor substrate 110 at a relatively great inclination angle with respect to the normal line of the second surface 110F2 of the semiconductor substrate 110 after the infrared light passes through the refractive structure 170. In this case, a light path in the semiconductor substrate 110 may be increased as compared to if the refractive structure 170 is not used. Thus, for example, the infrared light absorption rate of the semiconductor substrate 110 may increase and the sensitivity of the image sensor 100 may be improved.

As the refractive structure 170 is formed on the second surface 110F2 of the semiconductor substrate 110, the interface between the second surface 110F2 of the semiconductor substrate 110 and the first anti-reflective layer 172 may be relatively flat and may have a relatively improved quality as compared to if the interface is subject to an etching damage. For example, without the etching damage to the second surface 110F2 of the semiconductor substrate 110, the second surface 110F2 of the semiconductor substrate 110 has a relatively improved crystalline quality and the dark current that may be generated by the deterioration of the crystalline quality of the semiconductor substrate 110 may be suppressed or prevented. Accordingly, the noise level due to the dark current may be reduced.

In addition, since the refractive pattern 174 includes polysilicon, the refractive structure 170 may act as a filter to absorb unwanted visible light incident on the photoelectric conversion region 120. Thus, the noise level due to the unwanted visible light may be reduced. Accordingly, in the image sensor 100, the noise may be reduced and the sensitivity may be increased.

Figure 3:
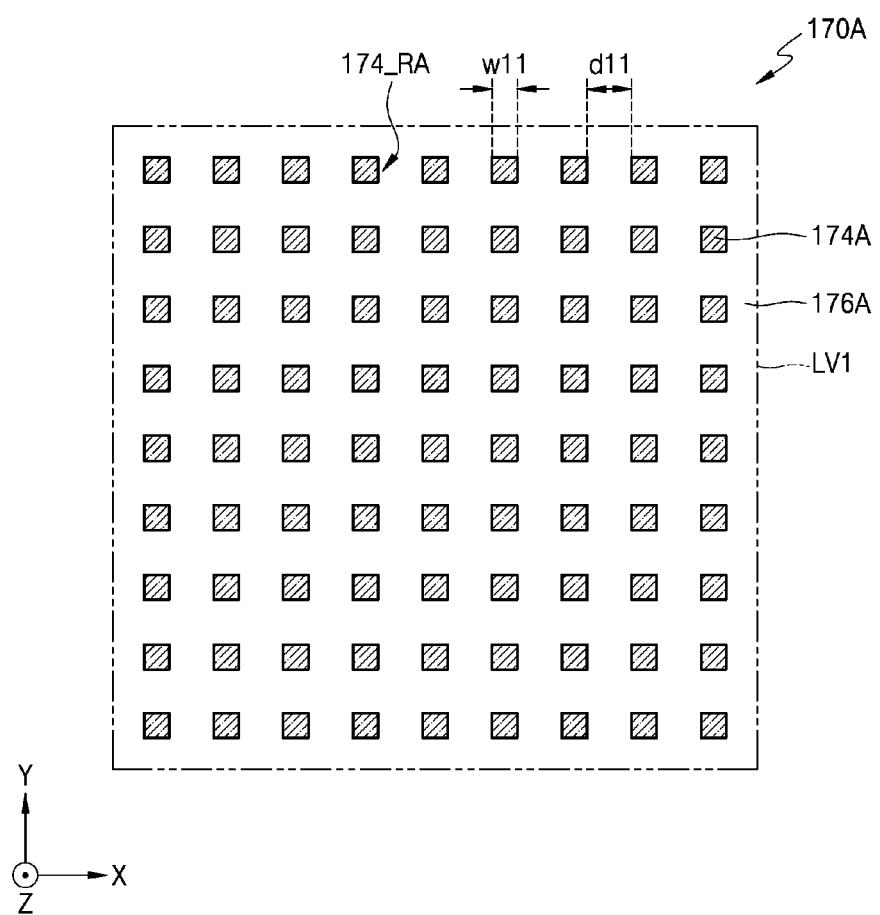
FIGS. 3, 4, and 5 are plan views illustrating a refractive structure according to example embodiments of the inventive concept.
Figure 4:
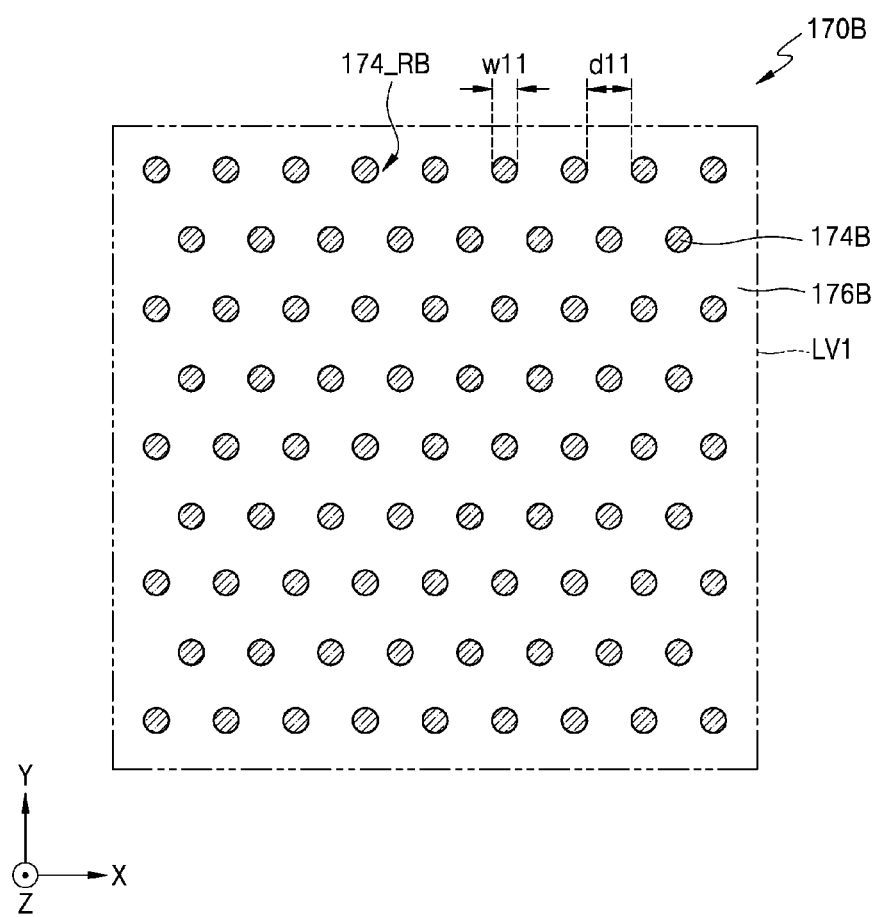
Figure 5:
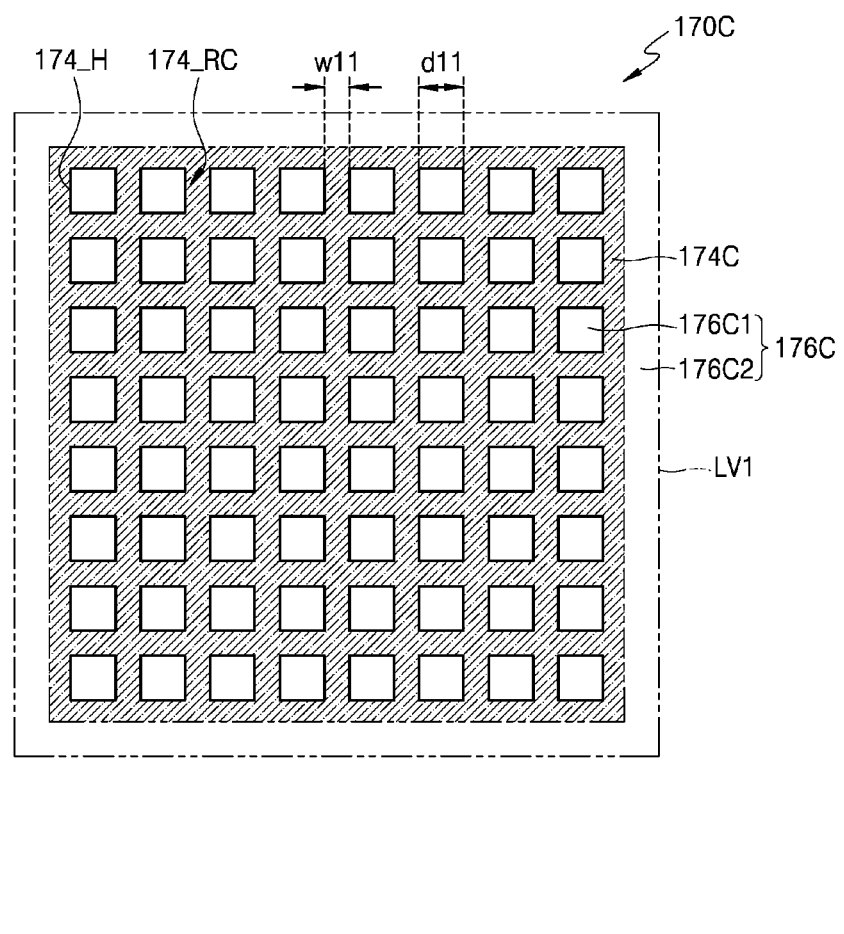

FIGS. 3, 4, and 5 are plan views illustrating a refractive structure according to example embodiments of the inventive concept. FIGS. 3 to 5 correspond to plan views at a level corresponding to the first level LV1 of FIG. 1. In FIGS. 3 to 5, the same reference numerals or the same reference designators are used to denote the same elements as those shown in FIGS. 1 and 2.

Referring to FIG. 3, a refractive structure 170A may include the first anti-reflective layer 172, a refractive pattern 174A, an insulation layer 176A, and the second anti-reflective layer 178. The refractive pattern 174A may include a plurality of first refractive parts 174_RA having a plurality of island shapes spaced apart from each other in both the first direction X and the second direction Y. The first refractive parts 174_RA may each have a rectangular horizontal section, but are not limited thereto.

For example, the plurality of first refractive parts 174_RA may each have a first width w11 in the first direction X and may be spaced apart from each other at a first distance d11 therebetween in the first direction X. The first widths w11 of the plurality of first refractive parts 174_RA may be the same and the first distances d11 between the plurality of first refractive parts 174_RA may be the same. The present invention is not limited thereto. In some embodiments, the first widths w11 of the plurality of first refractive parts 174_RA may be different and the first distances d11 between the plurality of first refractive parts 174_RA may be different. In some embodiments, at least one of the plurality of first refractive parts 174_RA may have a width different from the first width w11 and may be spaced apart from another at a distance different from the first distance d11.

Referring to FIG. 4, a refractive structure 170B may include the first anti-reflective layer 172, a refractive pattern 174B, an insulation layer 176B, and the second anti-reflective layer 178. The refractive pattern 174B may include a plurality of first refractive parts 174_RB having a plurality of island shapes spaced apart from each other in both the first direction X and the second direction Y. For example, each row of the plurality of first refractive parts 174_RB may be offset in the first direction X from its previous row, and thus the plurality of first refractive parts 174_RB may be arranged in a zigzag shape or a staggered shape.

Each of the plurality of first refractive parts 174_RB may have a circular horizontal section shape, but is not limited thereto. For example, each of the plurality of first refractive parts 174_RB may have various horizontal shape, such as an elliptical, trapezoidal, diamond, triangular, pentagonal, or hexagonal shape.

Referring to FIG. 5, a refractive structure 170C may include the first anti-reflective layer 172, a refractive pattern 174C, an insulation layer 176C, and the second anti-reflective layer 178. The refractive pattern 174C may include a plurality of first refractive parts 174_RC. The plurality of first refractive parts 174_RC may include a plurality of holes 174_H arranged in both the first direction X and the second direction Y. Parts of the refractive pattern 174C between the plurality of holes 174_H may refer to respective ones of the plurality of first refractive parts 174_RC.

The insulation layer 176C may be disposed on the first anti-reflective layer 172 and may fill spaces between the plurality of first refractive parts 174_RC. The plurality of holes 174_H may have plurality of island shapes spaced apart from each other in both the first direction X and the second direction Y, and the insulation layer 176C may fill the plurality of holes 174_H and may cover sidewalls of the plurality of first refractive parts 174_RC. A first portion 176C1 of the insulation layer 176C may fill the plurality of holes 174_H and a second portion 176C2 of the insulation layer 176C may surround a perimeter of the refractive pattern 174C and may extend in both the first direction X and the second direction Y. In an example embodiment, the plurality of first refractive parts 174_RC may be connected to each other to form the plurality of holes 174_H.

Figure 6:
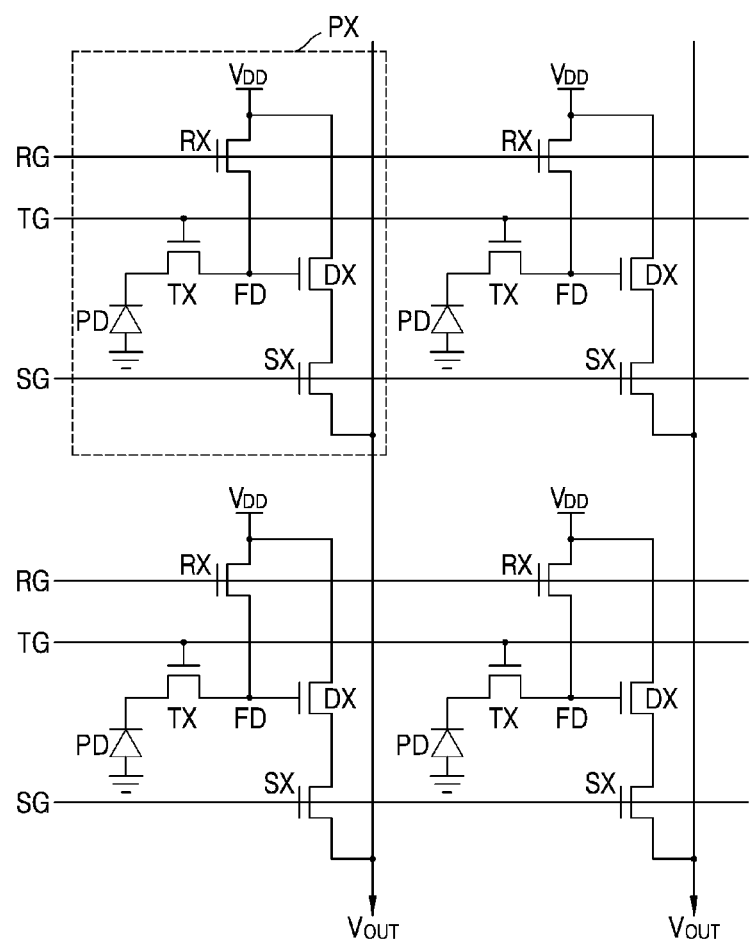
FIG. 6 is an equivalent circuit diagram of an active pixel of the image sensor of FIGS. 1 and 2 according to example embodiments of the inventive concept.

FIG. 6 is an equivalent circuit diagram of the active pixel PX of the image sensor 100 of FIGS. 1 and 2 according to example embodiments of the inventive concept.

Referring to FIG. 6, the plurality of active pixels PX may be arranged in a matrix form. Each of the plurality of active pixels PX may include the transfer transistor TX and the logic transistors RX, SX, and DX. Herein, the logic transistors may include the reset transistor RX, the select transistor SX, and the drive transistor (or source follower transistor) DX. The reset transistor RX may include a reset gate RG. The select transistor SX may include a select gate SG. The transfer transistor TX ma include the transfer gate TG.

Each of the plurality of active pixels PX may further include a photoelectric conversion device PD and the floating diffusion region FD. The photoelectric conversion device PD may correspond to the photoelectric conversion region 120 described with reference to FIGS. 1 and 2. The photoelectric conversion device PD may generate and accumulate photo charges in proportion to an amount of the light incident from the outside and may be include a photo diode, a photo transistor, a photo gate, a pinned photo diode, or a combination thereof.

The transfer transistor TX may transfer the photo charges generated in the photoelectric conversion device PD to the floating diffusion region FD. The floating diffusion region FD may receive the photo charges generated in the photoelectric conversion device PD and may cumulatively store the photo charges. The drive transistor DX may be controlled depending on an amount of the photo charges accumulated in the floating diffusion region FD.

The reset transistor RX may be configured to periodically reset the photo charges accumulated in the floating diffusion region FD. A drain electrode of the reset transistor RX may be connected to the floating diffusion region FD, and a source electrode of the reset transistor RX may be connected to a power voltage $V_{DD}$.

When the reset transistor RX is turned on, the power voltage $V_{DD}$ connected to the source electrode of the reset transistor RX may be transferred to the floating diffusion region FD. When the reset transistor RX is turned on, the photo charges accumulated in the floating diffusion region FD may be discharged to the power voltage $V_{DD}$, and thus the floating diffusion region FD is reset.

The drive transistor DX may be connected to a current source (not shown) disposed outside the plurality of active pixels PX to act as a source follower buffer amplifier to amplify a potential change in the floating diffusion region FD. The drive transistor DX may be configured to output the amplified potential change to an output line $V_{OUT}$.

The select transistor SX may be configured to select the plurality of active pixels PX row by row. When the select transistor SX is turned on, the power voltage $V_{DD}$, which is an output of the drive transistor DX, may be transferred to the source electrode of the drive transistor DX.

Figure 7:
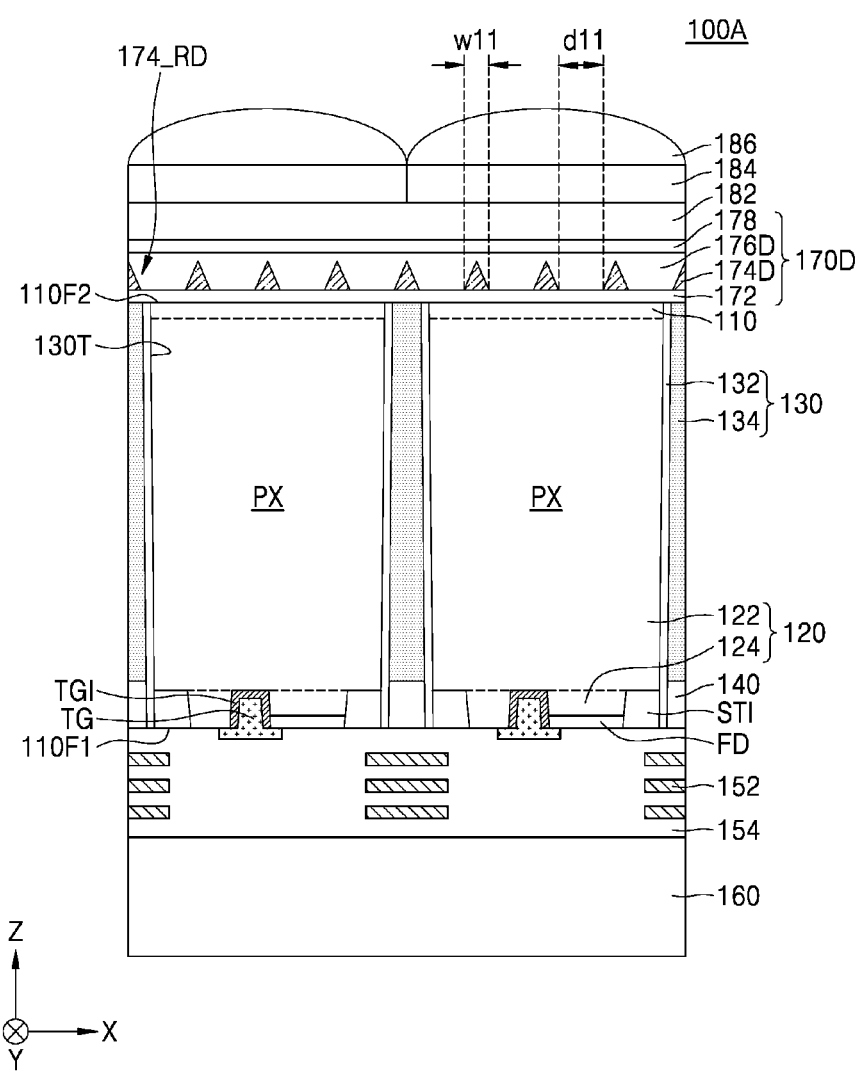
FIG. 7 is a cross-sectional view of an image sensor according to example embodiments of the inventive concept.

FIG. 7 is a cross-sectional view of an image sensor 100A according to example embodiments of the inventive concept. In FIG. 7, the same reference numerals or the same reference designators are used to denote the same elements as those shown in FIGS. 1 to 6.

Referring to FIG. 7, a refractive structure 170D may include the first anti-reflective layer 172, a refractive pattern 174D, an insulation layer 176D, and the second anti-reflective layer 178.

The refractive pattern 174D may include a plurality of first refractive parts 174_RD. The plurality of first refractive parts 174_RD may each have a first width w11 in the first direction X and may be spaced from each other at a first distance d11 in the first direction X. The first width w11 of each first refractive parts 174_RD may gradually decrease in a direction away from the second surface 110F2 of the semiconductor substrate 110. For example, each of the plurality of first refractive parts 174_RD may have a triangular cross section.

The insulation layer 176D may be disposed on the first refractive parts 174_RD and may fill spaces between the plurality of first refractive parts 174_RD. The insulation layer 176D may have a thickness enough to cover sidewalls of the plurality of first refractive parts 174_RD. The second anti-reflective layer 178 may be disposed on the insulation layer 176D and may not be in direct contact with the plurality of first refractive parts 174_RD. In some embodiments, the insulation layer 176D may be formed to have a thickness equal to a height of each of the first refractive parts 174_RD in the vertical direction Z, and thus the second anti-reflective layer 178 may contact uppermost surfaces of the plurality of first refractive parts 174_RD. A planar layout of the refractive pattern 174D may be the same as the planar layout of any one of the refractive patterns 174, 174A, 174B, and 174C shown in FIGS. 2 to 5.

In an example embodiment, the second anti-reflective layer 178 may be omitted. In this case, a passivation layer 182 may be disposed on the insulation layer 176D.

According to a method of manufacturing the image sensor 100A according to example embodiments, the first anti-reflective layer 172 may be formed on the second surface 110F2 of the semiconductor substrate 110, a refractive pattern layer may be formed on the first anti-reflective layer 172 using polysilicon, a mask pattern may be formed on the refractive pattern layer, and the refractive pattern layer may be patterned using the mask pattern to form the refractive pattern 174D including the plurality of first refractive parts 174_RD. In the patterning process of the refractive pattern layer, the refractive pattern 174D may be formed to have a profile in which the first width w11 thereof gradually decreases in a direction away from the second surface 110F2 of the semiconductor substrate 110 by controlling an etching condition. Thereafter, the insulation layer 176D may be formed on the refractive pattern 174D.

According to example embodiments, as the refractive structure 170 including the refractive pattern 174D is formed on the second surface 110F2 of the semiconductor substrate 110, it may be possible to form the refractive pattern 174D of various sizes and shapes. Accordingly, the degree of freedom of the process of forming the refractive pattern 174D may be improved.

Figure 8:
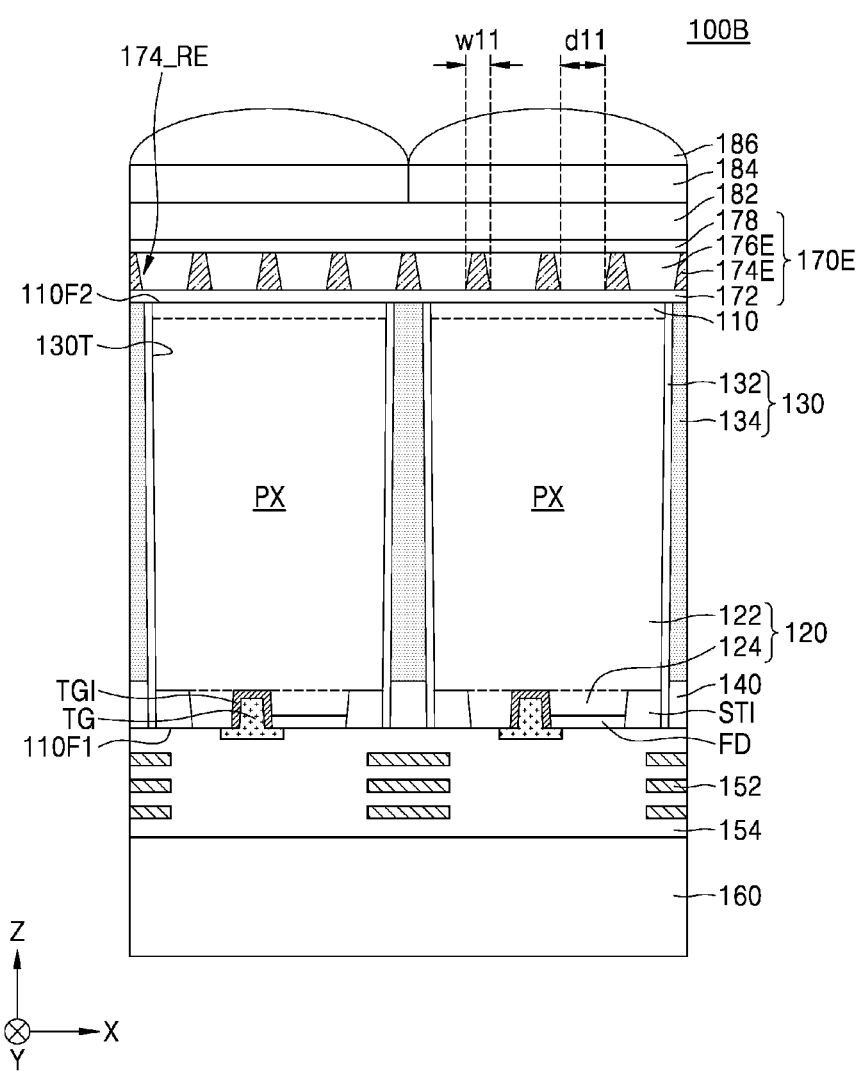
FIG. 8 is a cross-sectional view of an image sensor according to example embodiments of the inventive concept.

FIG. 8 is a cross-sectional view of an image sensor 100B according to example embodiments of the inventive concept. In FIG. 8, the same reference numerals or the same reference designators are used to denote the same elements as those shown in FIGS. 1 to 7.

Referring to FIG. 8, a refractive structure 170E may include the first anti-reflective layer 172, a refractive pattern 174E, an insulation layer 176E, and the second anti-reflective layer 178.

The refractive pattern 174E may include a plurality of first refractive parts 174_RE. The plurality of first refractive parts 174_RE may each have a first width W11 in a first direction X and may be spaced apart from each other at a first distance d11 in the first direction X. A sidewall of each of the plurality of first refractive parts 174_RE may be inclined, and the width W11 of each of the plurality of first refractive parts 174_RE may gradually decrease in a direction away from the second surface 110F2 of the semiconductor substrate 110. Thus, the first distance d11 between the plurality of first refractive parts 174_RE may gradually increase in the direction away from the second surface 110F2 of the semiconductor substrate 110. The plurality of first refractive parts 174_RE may each have a trapezoidal cross section.

The insulation layer 176E may disposed on the first anti-reflective layer 172 and may fill spaces between the plurality of first refractive parts 174_RE. An upper surface of the insulation layer 176E may be coplanar with an upper surface of each of the plurality of first refractive parts 174_RE. In an example embodiment, the upper surface of the insulation layer 176E and the upper surface of each of the plurality of first refractive parts 174_RE may be located at the same height from the first anti-reflective layer 172. The second anti-reflective layer 178 may be disposed on the plurality of first refractive parts 174_RE and the insulation layer 176E. A planar layout of the refractive pattern 174E may be the same as the planar layout of any one of the refractive patterns 174, 174A, 174B, and 174C shown in FIGS. 2 to 5.

Figure 9:
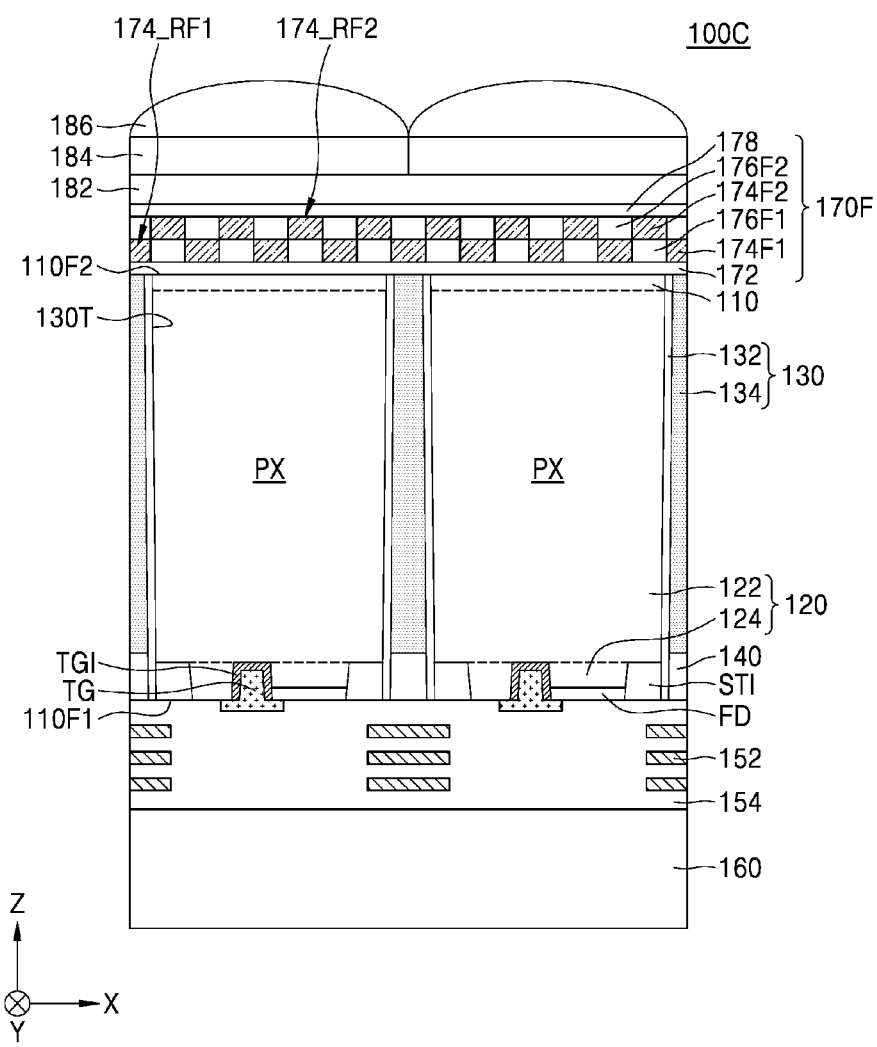
FIG. 9 is a cross-sectional view of an image sensor according to example embodiments of the inventive concept.
Figure 10:
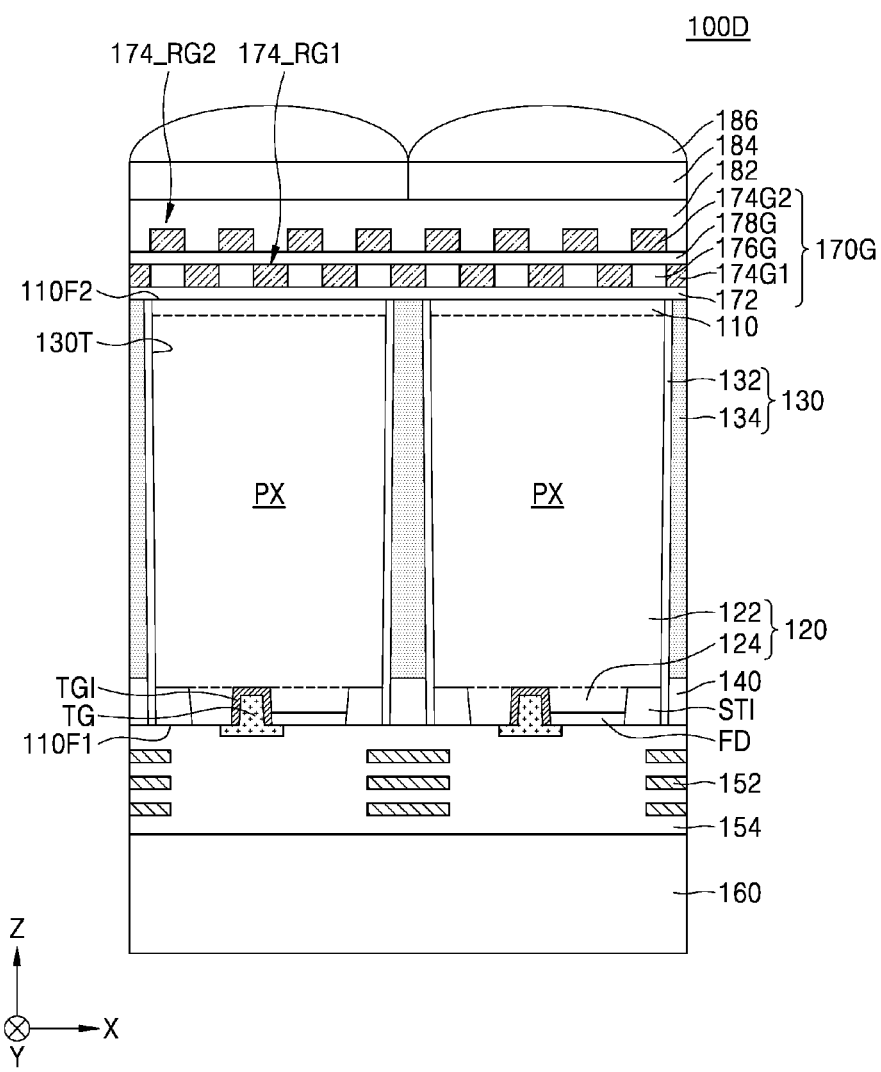
FIG. 10 is a cross-sectional view of an image sensor according to example embodiments of the inventive concept.
Figure 11:
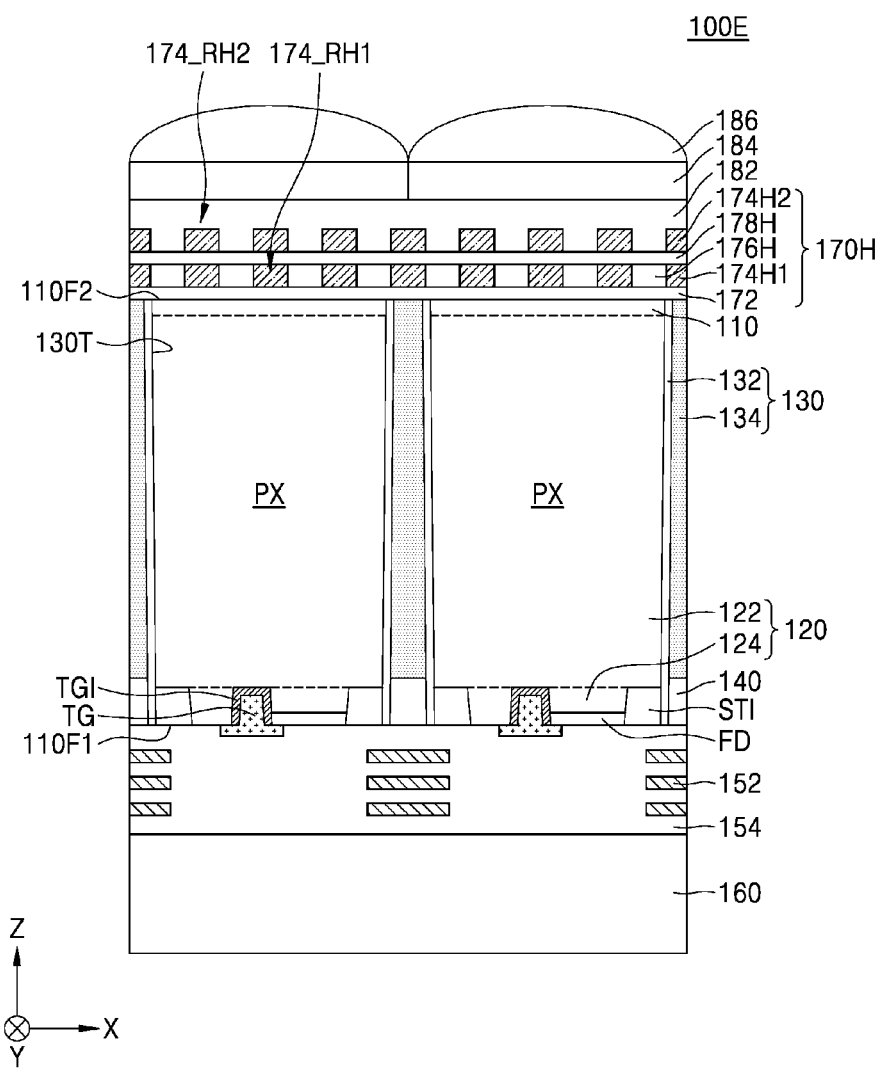
FIG. 11 is a cross-sectional view of an image sensor according to example embodiments of the inventive concept.

FIGS. 9, 10, and 11 are cross-sectional views of image sensors 100C, 100D, and 100E according to example embodiments of the inventive concept. In FIGS. 9 to 11, the same reference numerals or the same reference designators are used to denote the same elements as those shown in FIGS. 1 to 8.

Referring to FIG. 9, a refractive structure 170F may include the first anti-reflective layer 172, a first refractive pattern 174F1, a first insulation layer 176F1, a second refractive pattern 174F2, a second insulation layer 176F2, and the second anti-reflective layer 178.

An upper surface of the first refractive pattern 174F1 may be coplanar with an upper surface of the first insulation layer 176F1. In an example embodiment, the upper surface of the first refractive pattern 174F1 and the upper surface of the first insulation layer 176F1 may be located at the same height from the first anti-reflective layer 172. The second refractive pattern 174F2 may be disposed over the first refractive pattern 174F1, and an upper surface of the second refractive pattern 174F2 may be coplanar with an upper surface of the second insulation layer 176F2. In an example embodiment, the upper surface of the second refractive pattern 174F2 and the upper surface of the second insulation layer 176F2 may be located at the same height from the first anti-reflective layer 172.

The first refractive pattern 174F1 may include a plurality of first refractive parts 174_RF1, and the second refractive pattern 174F2 may include a plurality of second refractive parts 174_RF2. The plurality of first refractive parts 174_RF1 and the plurality of second refractive parts 174_RF2 may not be vertically overlapped with each other, but the inventive concept is not limited thereto. A planar layout of the first refractive pattern 174F1 and the second refractive pattern 174F2 may be the same as the planar layout of any one of the refractive patterns 174, 174A, 174B, and 174C shown in FIGS. 2 to 5.

Referring to FIG. 10, a refractive structure 170G may include the first anti-reflective layer 172, a first refractive pattern 174G1, an insulation layer 176G, a second refractive pattern 174G2, and the second anti-reflective layer 178G.

An upper surface of the first refractive pattern 174G1 may be coplanar with an upper surface of the insulation layer 176G. In an example embodiment, the upper surface of the first refractive pattern 174G1 and the upper surface of the insulation layer 176G may be located at the same height from the first anti-reflective layer 172. The second anti-reflective layer 178G may be disposed on the first refractive pattern 174G1 and the insulation layer 176G. The second refractive pattern 174G2 may be disposed on the second anti-reflective layer 178G. The passivation layer 182 may be disposed to cover the second refractive pattern 174G2.

The first refractive pattern 174G1 may include a plurality of first refractive parts 174_RG1. The second refractive pattern 174G2 may include a plurality of second refractive parts 174_RG2. In an example embodiment, the passivation layer 182 may be disposed to cover an upper surface and sidewalls of each of the plurality of second refractive parts 174_RG2. The plurality of first refractive parts 174_RG1 and the plurality of second refractive parts 174_RG2 may not be vertically overlapped with each other, but the inventive concept is not limited thereto. A planar layout of the first refractive pattern 174G1 and the second refractive pattern 174G2 may be the same as the planar layout of any one of the refractive patterns 174, 174A, 174B, and 174C shown in FIGS. 2 to 5.

Referring to FIG. 11, the refractive structure 170H may include the first anti-reflective layer 172, a first refractive pattern 174H1, an insulation layer 176H, a second refractive pattern 174H2, and a second anti-reflective layer 178H.

The first refractive pattern 174H1 may include a plurality of first refractive parts 174_RH1. The second refractive pattern 174H2 may include a plurality of second refractive parts 174_RH2. The plurality of first refractive parts 174_RH1 and the plurality of second refractive parts 174_RH2 may be vertically overlapped with each other. A planar layout of the first refractive pattern 174H1 and the second refractive pattern 174H2 may be the same as the planar layout of any one of the refractive patterns 174, 174A, 174B, and 174C shown in FIGS. 2 to 5.

According to the image sensors 100C, 100D, and 100E described with reference to FIGS. 9 to 11, the refractive structures 170F, 170G, and 170H may be formed of stack structures in which respective ones of the first refractive patterns 174F1, 174G1, and 174H1 and corresponding ones of the second refractive patterns 174F2, 174G2, and 174H2 are stacked.

The light incident on the second surface 110F2 of the semiconductor substrate 110 may be refracted by the refractive structures 170F, 170G, and 170H before the light passes through the second surface 110F2 of the semiconductor substrate 110 and may enter the inside of the semiconductor substrate 110 at a relatively great inclination angle with respect to the normal line of the second surface 110F2 of the semiconductor substrate 110 as compared to if no refractive structures are disposed on the second surface 110F2. For example, when the infrared light is incident on the second surface 110F2 of the semiconductor substrate 110, the infrared light may enter the inside of the semiconductor substrate 110 at an increased inclination angle with respect to the normal line of the second surface 110F2 of the semiconductor substrate 110 after the infrared light passes through the refractive structures 170F, 170G, and 170H. In this case, a light path in the semiconductor substrate 110 may increase. Thus, for example, the infrared light absorption rate of the semiconductor substrate 110 may increase and the sensitivities of the image sensors 100C, 100D, and 100E may increase.

Since the refractive structures 170F, 170G, and 170H of relatively complicated structure is formed even without forming the recess in the second surface 110F2 of the semiconductor substrate 110 by the etching process, the dark current that may be generated by the deterioration of the crystalline quality of the semiconductor substrate 110 may be suppressed or prevented, and thus the noise level due to the dark current may be reduced.

The refractive structures 170F, 170G, and 170H may each act as a filter to absorb unwanted visible light incident on the photoelectric conversion region 120. Thus, the noise level due to incidence of the unwanted visible light may be reduced.

FIGS. 12, 13, 14, 15 and 16 are cross-sectional views illustrating a method of manufacturing the image sensor 100 of FIG. 1 according to example embodiments of the inventive concept. In FIGS. 12 to 16, the same reference numerals or the same reference designators are used to denote the same elements as those shown in FIGS. 1 to 11.

Figure 12:
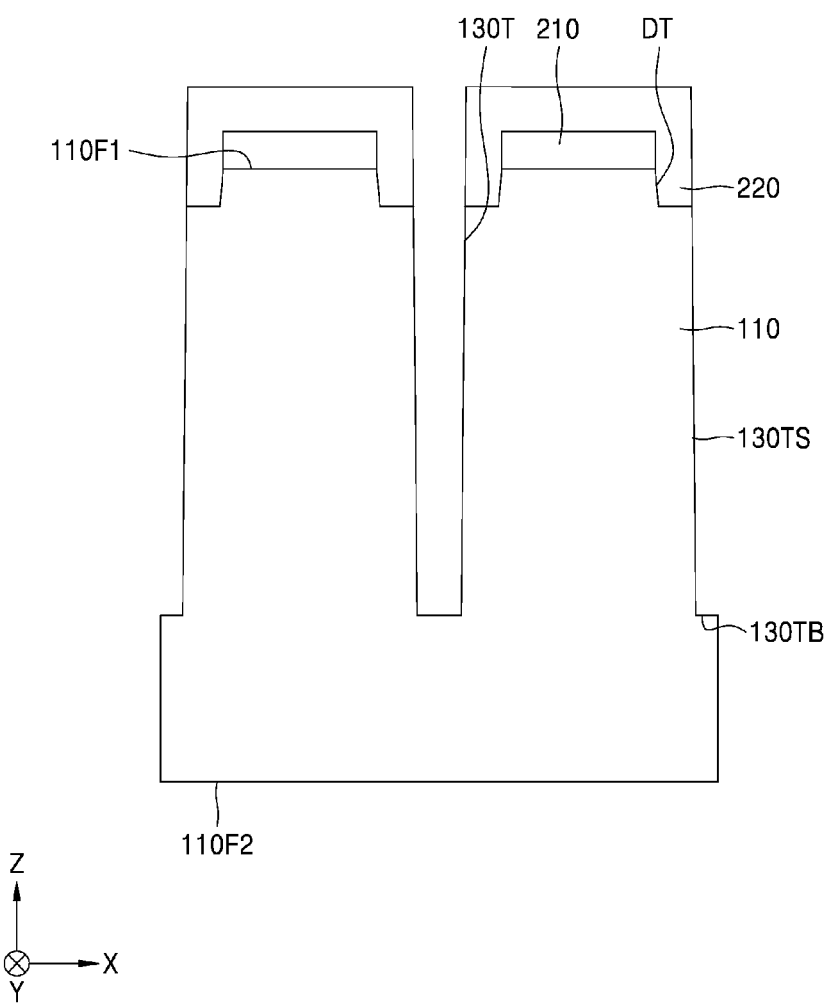
FIGS. 12, 13, 14, 15 and 16 are cross-sectional views illustrating a method of manufacturing an image sensor according to example embodiments of the inventive concept.

Referring to FIG. 12, the semiconductor substrate 110 having the first surface 110F1 and the second surface 110F2 opposite to each other may be prepared.

A first mask layer 210 including openings may be formed on the first surface 110F1 of the semiconductor substrate 110. The semiconductor substrate 110 may be etched from the first surface 110F1 of the semiconductor substrate 110 using the first mask layer 210 to form a device isolation trench DT. A device isolation insulation layer 220 may be formed on the first surface 110F1 of the semiconductor substrate 110 and the first mask layer 210 to fill the device isolation trench DT. The device isolation insulation layer 220 may be formed of silicon oxide, silicon oxynitride, or silicon nitride.

A mask pattern may be formed on the device isolation insulation layer 220, and then the device isolation insulation layer 220 and the semiconductor substrate 110 may be etched using the mask pattern to form the pixel trench 130T in the semiconductor substrate 110.

A width of a lower surface 130TB of the pixel trench 130T may be smaller than a width of the pixel trench 130T at a level of the first surface 110F1 of the semiconductor substrate 110. A sidewall 130TS of the pixel trench 130T may be slightly inclined, such that the pixel trench 130T may be downwardly tapered toward the second surface 110F2 of the semiconductor substrate 110. However, the inventive concept is not limited thereto.

Figure 13:
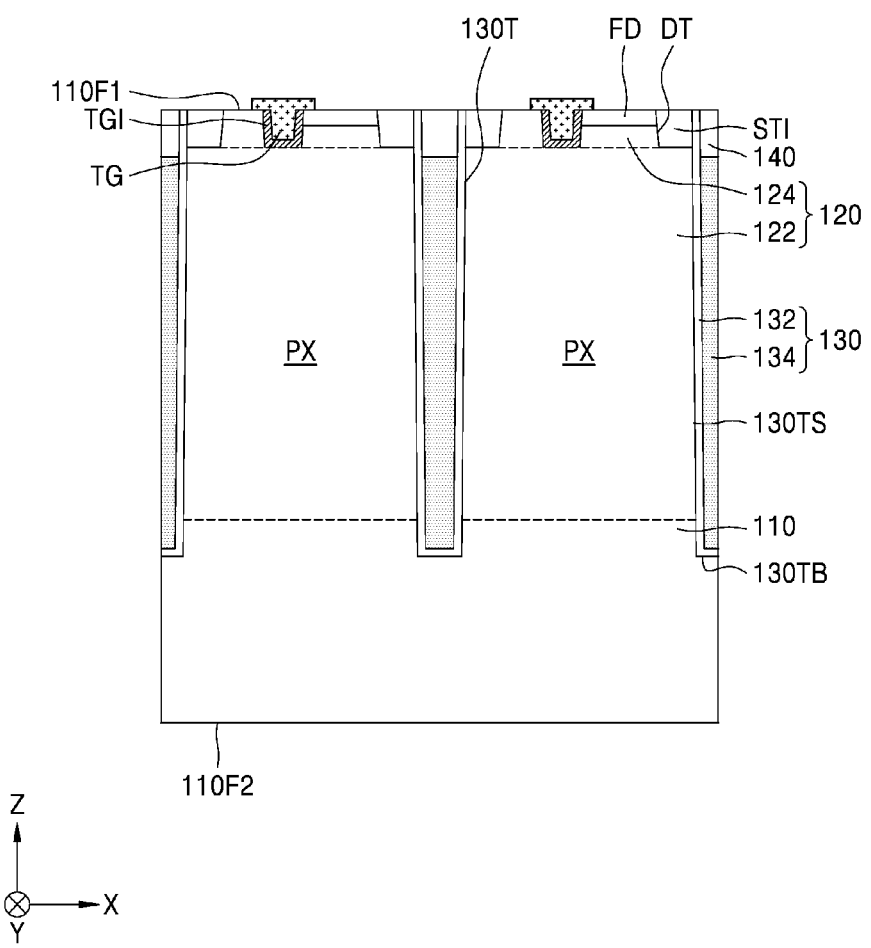

Referring to FIG. 13, a preliminary insulation liner and a conductive layer may be formed on the device isolation insulation layer 220 and the inner surface of the pixel trench 130T by a chemical vapor deposition process or an atomic layer vapor deposition, and a portion of the preliminary insulation liner and a portion of the conductive layer may be removed to form the insulation liner 132 and the buried conductive layer 134 remaining in the pixel trench 130T.

A portion of the buried conductive layer 134 in an upper (or inlet) portion of the pixel trench 130T may be etched-back, and then the buried insulation layer 140 may be formed to fill the exposed upper portion of the pixel trench 130T using an insulating material.

A portion of the buried insulation layer 140, a portion of the insulation liner 132, a portion of the device isolation insulation layer 220, and the first mask layer 210 may be removed to expose the first surface 110F1 of the semiconductor substrate 110. A remainder of the device isolation insulation layer 220 in the device isolation trench DT may refer to the device isolation layer ST1.

An ion implantation process may be performed on the first surface 110F1 of the semiconductor substrate 110 to form the photoelectric conversion region 120 including the photodiode region 122 and the well region 124. For example, the photodiode region 122 may be formed by doping with an n-type impurity, and the well region 124 may be formed by doping with a p-type impurity.

The gate structure including the transfer gate TG and the transfer gate insulation layer TGI may be formed on the first surface 110F1 of the semiconductor substrate 110, and an ion implantation process may be performed on a portion of the first surface 110F1 of the semiconductor substrate 110 to form a floating diffusion region FD and the active region (not shown).

Figure 14:
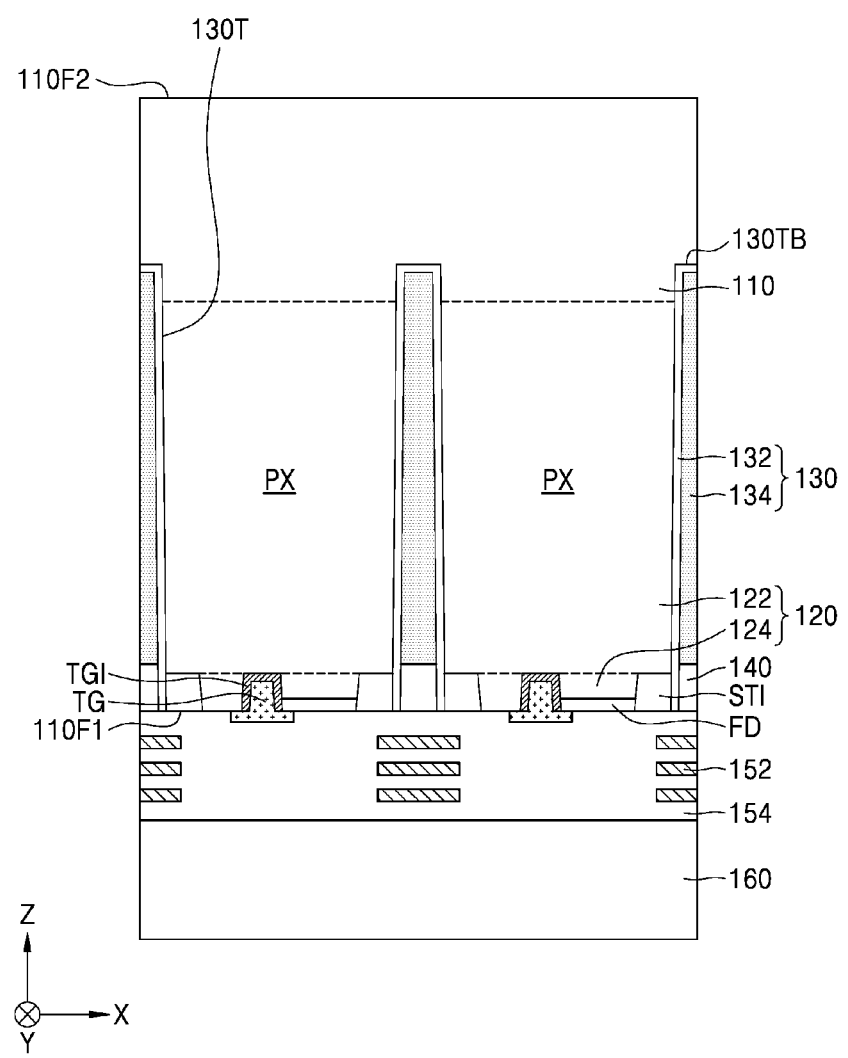

Referring to FIG. 14, the wiring structure 152 and the first interlayer insulation layer 154 covering the wiring structure 152 may be formed on the first surface 110F1 of the semiconductor substrate 110 by repeatedly performing a process step of forming a conductive layer over the first surface 110F1 of the semiconductor substrate 110, patterning a conductive layer, and forming an insulation layer covering the patterned conductive layer.

The supporting substrate 160 may be bonded to the first interlayer insulation layer 154. An adhesive layer (not shown) may be interposed between the supporting substrate 160 and the first interlayer insulation layer 154.

The semiconductor substrate 110 may be reversed such that the second surface 110F2 of the semiconductor substrate 110 may face up. Herein, the lower surface 130TB of the pixel trench 130T may not be exposed on the second surface 110F2 of the semiconductor substrate 110.

Figure 15:
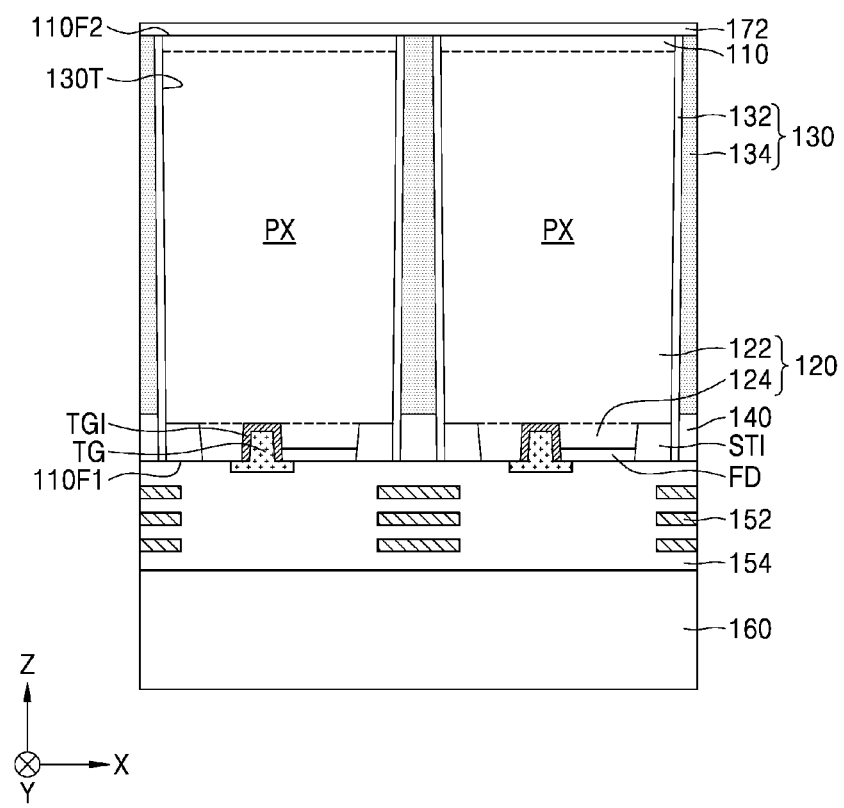

Referring to FIG. 15, a portion of the semiconductor substrate 110 may be removed from the second surface 110F2 of the semiconductor substrate 110 by performing a planarization process, such as a chemical-mechanical polishing (CMP) process or an etch back process, until the buried conductive layer 134 is exposed. As the removal process is performed, a level of the second surface 110F2 of the semiconductor substrate 110 may be lowered.

One active pixel PX surrounded by the pixel isolation layer 130 may be electrically and physically separated from another pixel PX adjacent thereto. The pixel trench 130T may extend from the first surface 110F1 of the semiconductor substrate 110 to the second surface 110F2 of the semiconductor substrate 110.

The first anti-reflective layer 172 may be formed on the second surface 110F2 of the semiconductor substrate 110, the buried conductive layer 134, and the insulation liner 132. The first anti-reflective layer 172 may include metal oxide, for example, hafnium oxide, aluminum oxide, or tantalum oxide, or an insulating material, for example, silicon oxide, silicon nitride, silicon oxynitride, or a low-k dielectric material.

Figure 16:
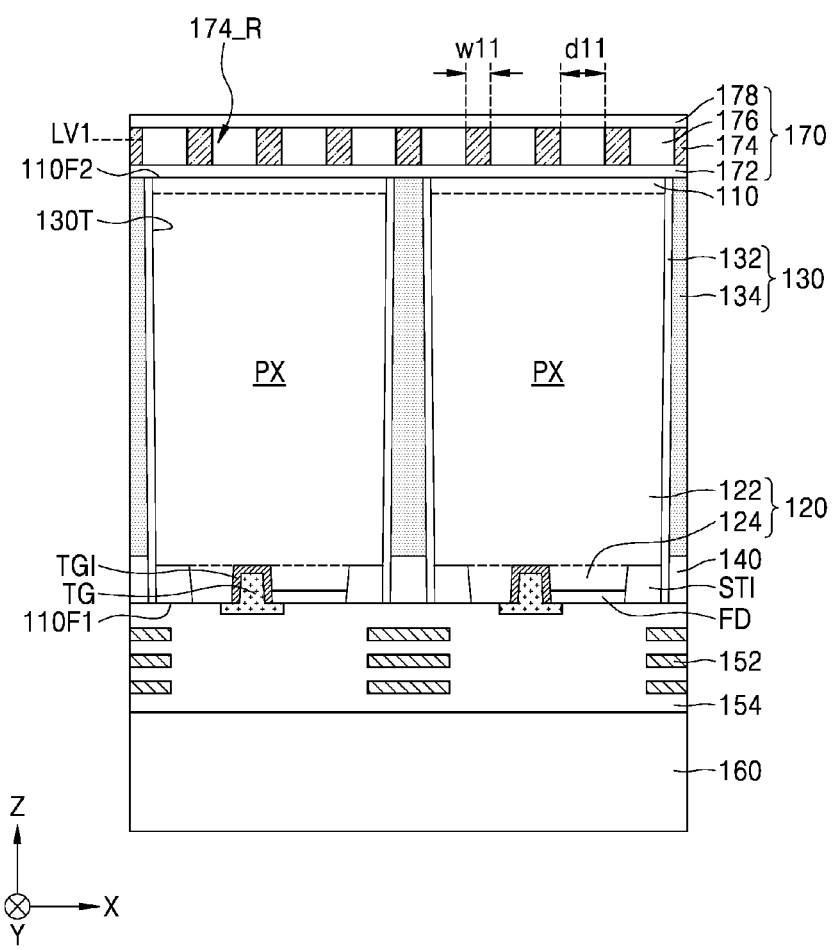

Referring to FIG. 16, a refractive pattern layer may be formed on the first anti-reflective layer 172 using polysilicon. A mask pattern may be formed on the refractive pattern layer, and the refractive pattern layer may be patterned using the mask pattern to form the refractive pattern 174 including the plurality of first refractive parts 174_R.

An insulation layer may be formed on the first anti-reflective layer 172 and the refractive pattern 174. An upper portion of the insulation layer may be planarized until an upper surface of the refractive pattern 174 is exposed, thus forming the insulation layer 176.

In some embodiments, the insulation layer 176 of a plurality of island shapes or a plurality of linear shapes may be formed on the first anti-reflective layer 172 using an insulating material. Thereafter, the refractive pattern 174 may be formed on the first anti-reflective layer 172 and the insulation layer 176 to fill spaces between the plurality of islands or the plurality of lines of the insulation layer 176 using polysilicon.

The second anti-reflective layer 178 may be formed on the refractive pattern 174 and the insulation layer 176. The second anti-reflective layer 178 may include metal oxide, for example, hafnium oxide, aluminum oxide, or tantalum oxide, or an insulating material, for example, silicon oxide, silicon nitride, silicon oxynitride, or a low-k dielectric material.

Referring again to FIG. 1, the passivation layer 182 may be formed on the refractive structure 170, and then the color filter 184 and the microlens 186 may be formed on the passivation layer 182. Accordingly, the image sensor 100 may be manufactured by the aforementioned processes.

In general, to improve the sensitivity of the infrared image sensor, a recess may be formed in the semiconductor substrate by an etching process, and then the recess may be filled with an insulating material to form a concave-convex pattern. However, the semiconductor substrate may be damaged by the etching process, and thus a dark current may increase. Accordingly, a noise level may increase.

According to the method of manufacturing the image sensor 100 according to example embodiments of the inventive concept, the second surface 110F2 of the semiconductor substrate 110 may not be etched and the refractive structure 170 may be formed by depositing a polysilicon layer on the semiconductor substrate 110 and patterning the polysilicon layer. Thus, since the etching damage to the second surface 110F2 of the semiconductor substrate 110 may be avoided and the second surface 110F2 of the semiconductor substrate 110 has a relatively improved crystalline quality, the dark current that may be generated by the deterioration of the crystalline quality of the semiconductor substrate 110 may be suppressed or prevented, and thus the noise level due to the dark current may be reduced. Therefore, in the image sensor 100, the noise may be reduced and the sensitivity may be increased.

As shown in FIGS. 3 to 5 and 7 to 11, the refractive structures 170A, 170B, 170C, 170D, 170E, 170F, 170G, and 170H having the various shapes and arrangements may be formed by depositing and patterning of the polysilicon layer. Thus, quantum efficiency (QE) of the image sensor 100 may be improved, and thus the refractive structures 170~170H with increased sensitivity may be easily formed.

While the present inventive concepts have been shown and described with reference to example embodiments thereof, it will be understood by those of ordinary skill in the art that various changes in form and details may be made thereto without departing from the spirit and scope of the present inventive concepts as set forth by the following claims.

What is claimed is:

1. An image sensor comprising:
   a semiconductor substrate having a first surface and a second surface opposite to the first surface;
   a wiring structure disposed on the first surface of the semiconductor substrate; and
   a refractive structure on the second surface of the semiconductor substrate,
   wherein the refractive structure comprises:
   a first anti-reflective layer disposed on the second surface of the semiconductor substrate;
   a refractive pattern disposed on the first anti-reflective layer, and including a plurality of first refractive parts spaced apart from each other;
   an insulation layer disposed on the first anti-reflective layer, and filling spaces between the plurality of first refractive parts; and
   a second anti-reflective layer disposed on the refractive pattern and the insulation layer,
   wherein the refractive pattern and the insulation layer are vertically interposed between the first anti-reflective layer and the second anti-reflective layer,
   wherein the refractive pattern further comprises a plurality of second refractive parts disposed over the plurality of first refractive parts, and
   wherein the second anti-reflective layer is continuously interposed between upper surfaces of the plurality of first refractive parts and lower surfaces of the plurality of second refractive parts.

2. The image sensor according to claim 1,
   wherein each of the plurality of first refractive parts has a linear shape with a first width in a first direction and extends in a second direction perpendicular to the first direction and parallel to the second surface of the semiconductor substrate.

3. The image sensor according to claim 1,
   wherein each of the plurality of first refractive parts has an island shape and the plurality of first refractive parts are arranged in a first direction and a second direction perpendicular to the first direction and parallel to the second surface of the semiconductor substrate.

4. The image sensor according to claim 1,
   wherein the plurality of first refractive parts are connected to each other so that the refractive structure includes a plurality of holes arranged in a first direction and a second direction perpendicular to the first direction and parallel to the second surface of the semiconductor substrate, and
   wherein the insulation layer fills the plurality of holes and has a plurality of island shapes separated from each other by the plurality of first refractive parts.

5. The image sensor according to claim 1,
   wherein each of the plurality of first refractive parts has a first width in a first direction, and
   wherein the first width decreases in a direction away from the second surface of the semi conductor substrate.

6. The image sensor according to claim 1, further comprising:
   a passivation layer disposed on the second anti-reflective layer and the plurality of second refractive parts; and
   a microlens disposed on the passivation layer.

7. The image sensor according to claim 1,
   wherein the refractive pattern includes polysilicon, and
   wherein a refractive index of the insulation layer is lower than a refractive index of the refractive pattern.

8. The image sensor according to claim 1,
   wherein the insulation layer includes a plurality of insulation patterns, and
   wherein the plurality of insulation patterns are spaced apart from each other, and completely fill spaces between the plurality of first refractive parts.

9. The image sensor according to claim 1,
   wherein an upper surface of the insulation layer is coplanar with upper surfaces of the plurality of first refractive parts.

10. The image sensor according to claim 1,
    wherein the plurality of second refractive parts do not vertically overlap the plurality of first refractive parts.

11. An image sensor comprising:
    a semiconductor substrate having a first surface and a second surface opposite to the first surface;
    a wiring structure disposed on the first surface of the semiconductor substrate; and
    a refractive structure on the second surface of the semiconductor substrate,
    wherein the refractive structure comprises:
    a first anti-reflective layer disposed on the second surface of the semiconductor substrate;
    a refractive pattern disposed on the first anti-reflective layer,
    wherein the refractive pattern includes a plurality of first refractive parts spaced apart from each other, and the second surface of the semiconductor substrate is flat;
    a second anti-reflective layer disposed on the refractive pattern; and
    an insulation layer disposed on the first anti-reflective layer, and filling spaces between the plurality of first refractive parts, and
    wherein the refractive pattern and the insulation layer are vertically interposed between the first anti-reflective layer and the second anti-reflective layer,
    wherein the refractive pattern further comprises a plurality of second refractive parts disposed over the plurality of first refractive parts, and
    wherein the second anti-reflective layer is continuously interposed between upper surfaces of the plurality of first refractive parts and lower surfaces of the plurality of second refractive parts.

12. The image sensor according to claim 11,
    wherein a refractive index of the insulation layer is lower than a refractive index of the refractive pattern.

13. The image sensor according to claim 12, further comprising:
    a passivation layer disposed on the refractive structure; and
    a microlens disposed on the passivation layer.

14. The image sensor according to claim 11,
    wherein each of the plurality of first refractive parts has a first width, and
    wherein the first width decreases in a direction away from the second surface of the semiconductor substrate.

15. An image sensor comprising:

a semiconductor substrate having a first surface and a second surface opposite to the first surface;

a wiring structure disposed on the first surface of the semiconductor substrate; and a refractive structure disposed on the second surface of the semiconductor substrate, wherein the refractive structure comprises:

a first anti-reflective layer disposed on the second surface of the semiconductor substrate;

a plurality of first refractive parts disposed on the first anti-reflective layer and spaced apart from each other in a first direction parallel to the second surface of the semiconductor substrate;

an insulation layer disposed on the first anti-reflective layer, and filling spaces between the plurality of first refractive parts; and a second anti-reflective layer disposed on the plurality of first refractive parts and the insulation layer, wherein the plurality of first refractive parts and the insulation layer are vertically interposed between the first anti-reflective layer and the second anti-reflective layer, wherein the plurality of first refractive parts include polysilicon, wherein a refractive index of the insulation layer is lower than a refractive index of each of the plurality of first refractive parts, wherein the refractive structure further comprises a plurality of second refractive parts disposed over the plurality of first refractive parts, and wherein the second anti-reflective layer is continuously interposed between upper surfaces of the plurality of first refractive parts and lower surfaces of the plurality of second refractive parts.

16. The image sensor according to claim 15, wherein each of the plurality of first refractive parts is spaced apart from the second surface of the semiconductor substrate, and wherein an upper surface of the insulation layer is located at the same height as an upper surface of each of the plurality of first refractive parts from the first anti-reflective layer.

17. The image sensor according to claim 15, wherein the insulation layer comprises:

a first insulation layer filling spaces between the plurality of first refractive parts; and a second insulation layer disposed over the first insulation layer and filling spaces between the plurality of second refractive parts.

* * * * *